(12) United States Patent  (10) Patent No.:     US 6,715,132 B1
Bartz et al.                    (45) Date of Patent:      Mar. 30, 2004

(54) DATASHEET BROWSING AND CREATION WITH DATA-DRIVEN DATASHEET TABS WITHIN A MICROCONTROLLER DESIGN TOOL

(75) Inventors: Manfred Bartz, Snohomish, WA (US); Marat Zhaksilikov, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 64 days.

(21) Appl. No.: 09/989,816

(22) Filed: Nov. 19, 2001

(51) Int. Cl.$^7$ .............................................. G06F 17/50
(52) U.S. Cl. ............................ 716/1; 345/764; 345/781
(58) Field of Search ..................... 716/1–18; 345/326, 345/333, 339, 348–350, 352, 353, 357, 761, 762, 763, 764, 781

(56) References Cited

U.S. PATENT DOCUMENTS

| | | | | |
|---|---|---|---|---|
| 5,983,277 | A | * | 11/1999 | Heile et al. .................. 709/232 |
| 6,014,135 | A | * | 1/2000 | Fernandes .................... 345/331 |
| 6,121,965 | A | * | 9/2000 | Kenney et al. ............... 345/339 |
| 6,239,798 | B1 | * | 5/2001 | Ludolph et al. ............. 345/340 |
| 6,263,339 | B1 | * | 7/2001 | Hirsch ......................... 707/102 |
| 6,282,547 | B1 | * | 8/2001 | Hirsch ......................... 707/102 |

OTHER PUBLICATIONS

Specks et al., "A Mixed Digital–Analog 16B Microcontroller with 0.5MB Flash Memory, On–Chip Power Supply, Physical Nework Interface, and 40V I/O for Automotive Single–Chip Mechatronics," IEEE, Feb. 9, 2000, pp. 348–349.*

Hsieh et al., "Modeling Micro–Controller Peripherals for High–Level Co–Simulation and Synthesis," IEEE, 1997, pp. 127–130.*

* cited by examiner

*Primary Examiner*—Vuthe Siek
(74) *Attorney, Agent, or Firm*—Wagner, Murabito & Hao LLP

(57) ABSTRACT

A method and system of rendering a workspace for helping a user design a microcontroller. A workspace having multiple windows is rendered. A first window of the workspace comprises at least one selectable user module wherein a user module is a pre-configured function operating with the microcontroller. Input indicating a selection of a user module is received. Responsive to the selection, a datasheet is automatically rendered in a second window of the workspace, wherein the datasheet provides technical details corresponding to the selected user module. In one embodiment, the workspace further comprises selectable tabs, wherein the tabs are rendered according to data of the datasheet. The tabs are operable for easy navigation of the datasheet.

26 Claims, 15 Drawing Sheets

```
v:shapes="_0000_s1041"><! [endif]><a
     name="tab_ADCINC12"></a></p>
     </td>
     <td width=151 valign=bottom style='width:113.4pt;padding:0in 5.4pt
0in 5.4pt'>
     <p class=MsoHeader align=right style='margin-bottom:0in;margin-
bottom: .0001pt;
     text-align:right;tab-stops:.5in'><!- - [if gte vml 1] ><v:shape
id="_x0000_i1025"
     type="#_x0000_t75" style='width:49.5pt;height:49.5pt' o:ole=" ">
     <v:imagedata src="./ADCINC_12 files/image003.wmz" o:title=" "/>
     </v:shape><! [endif]- -><! [if !vml] ><img width=66 height=66
     src="./ADCINC_12 files/image004.gif"
v:shapes="_x0000_i1025"><! [endif] ><! - - [if gte mso 9] ><xml>
     <o:OLEObject Type="Embed" ProgId="Visio.Drawing.6"
ShapeID="_x0000_i1025"
     DrawAspect="Content" ObjectID="_1065938588">
     </o:OleObject>
     </xml><! [endif] - -></p>
     </td>
     </tr>
     </table>

<p class=MsoTitle style='margin-top:12.0pt;tab-stops:right 6.5in
7.0in'>12-Bit
Incremental ADC<span style='mso-tab-
count:1'>
     </span><a
name=ModuleName>ADCINC12</a><br>
<span style='mso-tab-
count:1'>
                                   </span><span
style='font-size:8.0pt;mso-bidi-font-size:12.0pt'>Revision C</span></p>

<div align=center>

<table border=1 cellspacing=0 cellpadding=0 style='border-
collapse:collapse;
     mso-table-layout-alt:fixed;border:none;mso-border-alt:solid windowtext
     .75pt;
```

Figure 8B

850cont.

```
        mso-padding-alt:0in 5.4pt 0in 5.4pt'>
        <tr>
         <td width=144 valign=top style='width:1.5in;border:solid windowtext
        .75pt;
         border-bottom:solid windowtext 1.5pt;background:#CCCCCC;padding:0in
        5.4pt 0in 5.4pt'>
          <p class=TableHeading style='margin:0in;margin-
        bottom: .0001pt'>resources<a
870 →   name="tab_resources"></a><span style='font-weight:normal;mso-bidi-
        font-weight:
          bold'>:</span></p>
         </td>
```

```
┌─────────────────────────────────────┐
│   SCANNING A DOCUMENT FOR EMBEDDED  │
│              ANCHORS                │
│               1010                  │
└─────────────────────────────────────┘
                  │
                  ▼
┌─────────────────────────────────────┐
│  RENDERING TABS FOR EACH EMBEDDED ANCHOR │
│               1020                  │
└─────────────────────────────────────┘
```

DATASHEET BROWSING AND CREATION WITH DATA-DRIVEN DATASHEET TABS WITHIN A MICROCONTROLLER DESIGN TOOL

FIELD OF INVENTION

The present invention generally relates to software applications. Specifically, the present invention relates to a design utility within an application, in particular an application used for designing a microcontroller.

BACKGROUND OF THE INVENTION

Microcontrollers function to replace mechanical and electromechanical components in a variety of applications and devices. Since they were first introduced approximately 30 years ago, microcontrollers have evolved to the point where they can be used for increasingly complex applications. Some microcontrollers in use today are also programmable, expanding the number of applications in which they can be used.

However, even though there are a large number of different types of microcontrollers available on the market with a seemingly wide range of applicability, it is still often difficult for a designer to find a microcontroller that is particularly suited for a particular application. Unique aspects of the intended application may make it difficult to find an optimum microcontroller, perhaps necessitating a compromise between the convenience of using an existing microcontroller design and less than optimum performance.

In those cases in which a suitable microcontroller is found, subsequent changes to the application and new requirements placed on the application will likely affect the choice of microcontroller. The designer thus again faces the challenge of finding a suitable microcontroller for the intended application.

Unfortunately, conventional tools available for designing, configuring and programming microcontrollers or other programmable electronic devices do not contain datasheets for providing technical details for the selectable microprocessor peripherals. The conventional tools typically require a user to open up a separate application for datasheet viewing or to have access to a bound catalog of peripherals having datasheets. Each of these datasheet viewing techniques has its own set of problems.

One problem with requiring a user to open up a separate application for datasheet viewing is that the new application and the software design program both require substantial screen space. To view both simultaneously requires either decreasing the viewing size of each, which would make viewing difficult, or toggling back and forth between applications, which is time consuming, is confusing and is difficult to operate. Another problem is that opening additional applications consumes additional computer memory, which may cause the computer system to function slower. Additionally, requiring a user to open up a separate application for datasheet viewing requires a user to be familiar with multiple applications, increasing training costs and application maintenance.

Alternatively, requiring a user to have access to a bound catalog of peripherals with corresponding datasheets also has a number of problems. For one, the user must have on hand catalogs having datasheets for every peripheral the user may require. This requires a concerted effort to maintain an up-to-date datasheet library, thereby increasing operating costs and creating new responsibilities for the person assigned to manage the library.

Datasheets are typically medium to large-sized documents, and require a large amount of screen space for proper viewing. As described above, conventional tools do not have the technology to afford a user with a convenient, easy to use method for viewing the datasheet for desired peripherals within the application. Current datasheet viewing techniques require a user to browse through an entire datasheet to find the desired information. Therefore, the current tools provide inefficient methods for datasheet browsing.

SUMMARY OF THE INVENTION

Accordingly, a need exists for a method or system for rendering a workspace for helping a user design a system for a programmable electronic device. A need also exists for a method or system that satisfies the above need and that renders an on-screen viewable datasheet for a selectable user module. A need also exists for a method or system that satisfies the above need and that provides easy navigation of the on-screen datasheet. The present invention provides a novel solution to these needs.

The present invention provides a method and system thereof for rendering a workspace for helping a user design a microcontroller. In one embodiment, the microcontroller utilizes a programmable single-chip architecture comprising both programmable digital and programmable analog blocks.

In one embodiment, a workspace having multiple windows is rendered, wherein a first window of the workspace comprises at least one selectable user module. A workspace is associated with one or more tasks used in designing a microcontroller. In one embodiment, the workspace is associated with selecting user modules in the design of the components within a programmable microcontroller. A user module is a pre-configured function or circuit design operating with the microcontroller.

Input indicating a selection of a user module is received. Responsive to the selection, a datasheet graphical user interface is automatically rendered in a second window of the workspace, wherein the datasheet provides technical details corresponding to the selected user module. The datasheet is tabbed for easy navigation thereof. In one embodiment, a data-driven technique is used for automatically rendering the tabs based on a data description of the datasheet.

In one embodiment, the first window is a catalog comprising a plurality of selectable user modules. In one embodiment, the catalog is a database or library of user modules, wherein the user modules of the database can be updated. In another embodiment, the first window comprises a listing of selected user modules. In one embodiment, the selected user modules are selected from a catalog window as described above.

In one embodiment, the workspace further comprises a window for rendering a histogram for displaying available programmable resources of the microcontroller. In another embodiment, the workspace further comprises a window for rendering a schematic corresponding to the selected user module.

As described above, the workspace may comprise selectable tabs with descriptive labels, wherein the tabs are rendered according to data of the datasheet. The tabs are operable for easy navigation of the datasheet.

In summary, the present invention is used to render a workspace for helping a user program a programmable microcontroller. The workspace comprises a datasheet for a selectable user module and provides easy navigation of the datasheet. The user is provided with a workspace for helping a user select the desirable user modules for use with a microcontroller, while directly providing the user with the technical information to select and configure the appropriate user module.

The present invention integrates the display of the datasheet information into the workspace that is used for user module selection. By integrating the datasheet, the user can easily switch back and forth through the available windows of the workspace to program the system and get quick reference to the datasheet at the same time. By integrating the windows, the user can adjust the sizes of the windows to provide optimum information presentation during program development.

These and other objects and advantages of the present invention will become obvious to those of ordinary skill in the art after having read the following detailed description of the preferred embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 6A, 6B and 6C are exemplary screen shots of a microcontroller design application having a datasheet with data-driven tabs in accordance with one embodiment of the present invention.

FIG. 8B is exemplary HTML code for an HTML document with embedded anchors for generating tabs therefrom in accordance with one embodiment of the present invention.

FIG. 10 is a flowchart of a process for helping a user browse a document in accordance with one embodiment of the present invention.

DETAILED DESCRIPTION

Figure 1:
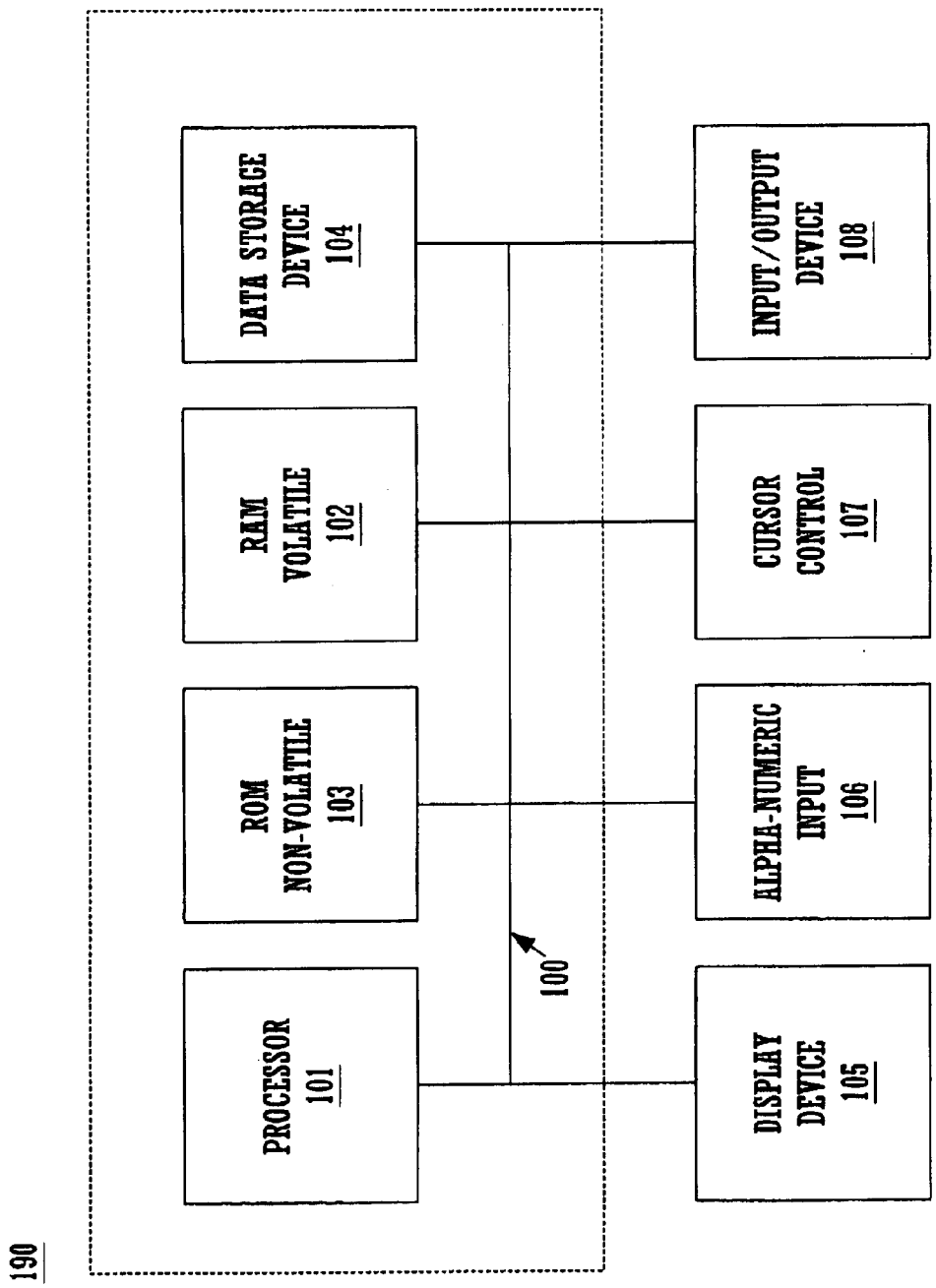
FIG. 1 is a block diagram of an exemplary computer system upon which embodiments of the present invention may be practiced.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, fragments, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "rendering," "receiving," "generating," "displaying," "scanning," "indicating," "interacting," "scrolling" or the like, refer to actions and processes (e.g., processes 300, 900 and 1000 of FIGS. 3, 9 and 10, respectively) of a computer system or similar electronic computing device. The computer system or similar electronic computing device manipulates and transforms data represented as physical (electronic) quantities within the computer system memories, registers or other such information storage, transmission or display devices. The present invention is well suited to use with other computer systems.

Refer now to FIG. 1, which illustrates an exemplary computer system 190 upon which embodiments of the present invention may be practiced. In general, computer system 190 comprises bus 100 for communicating information, processor 101 coupled with bus 100 for processing information and instructions, random access (volatile) memory (RAM) 102 coupled with bus 100 for storing information and instructions for processor 101, read-only (non-volatile) memory (ROM) 103 coupled with bus 100 for storing static information and instructions for processor 101, data storage device 104 such as a magnetic or optical disk and disk drive coupled with bus 100 for storing information and instructions, an optional user output device such as display device 105 coupled to bus 100 for displaying information to the computer user, an optional user input device such as alphanumeric input device 106 including alphanumeric and function keys coupled to bus 100 for communicating information and command selections to processor 101, and an optional user input device such as cursor control device 107 coupled to bus 100 for communicating user input information and command selections to processor 101. Furthermore, an optional input/output (I/O) device 108 is used to couple computer system 190 onto, for example, a network.

Display device 105 utilized with computer system 190 may be a liquid crystal device, cathode ray tube, or other display device suitable for creating graphic images and alphanumeric characters recognizable to the user. Cursor control device 107 allows the computer user to dynamically signal the two-dimensional movement of a visible symbol (pointer) on a display screen of display device 105. Many implementations of the cursor control device are known in the art including a trackball, mouse, joystick or special keys on alphanumeric input device 106 capable of signaling movement of a given direction or manner of displacement. It is to be appreciated that the cursor control 107 also may be directed and/or activated via input from the keyboard using special keys and key sequence commands. Alternatively, the cursor may be directed and/or activated via input from a number of specially adapted cursor directing devices.

Microcontroller suppliers (specifically, Cypress MicroSystems, Inc., in Bothell, Wash.) have started to offer standard parts that combine a microprocessor with several user-configurable "building blocks." These building blocks may be assembled, configured and programmed to form many standard microprocessor peripherals, as well as to form unique peripherals as may be required by a specific application. Thus, a user can tailor a microcontroller to meet his or her specific requirements, in less time and at less cost than through other means. A microcontroller assembled from these building blocks is referred to herein as a programmable microcontroller architecture.

The present invention is described in the context of a software tool, portions of which are comprised of computer-readable and computer-executable instructions which reside, for example, in computer-usable media of a computer system such as that exemplified by FIG. 1. The present invention is primarily described as being used with a tool for designing, configuring, programming, compiling, building (assembling), emulating, and debugging an embedded microcontroller, in particular a class of microcontrollers that provide analog and/or digital subsystems comprising many dynamically configurable blocks. An example of this class is referred to herein as a programmable microcontroller architecture. Additional information regarding exemplary programmable microcontroller architectures is provided in the co-pending, commonly-owned U.S. patent application Ser. No. 10/033,027, filed Oct. 22,2001, by W. Snyder, and entitled "Programmable Microcontroller Architecture," hereby incorporated by reference.

Figure 2A:
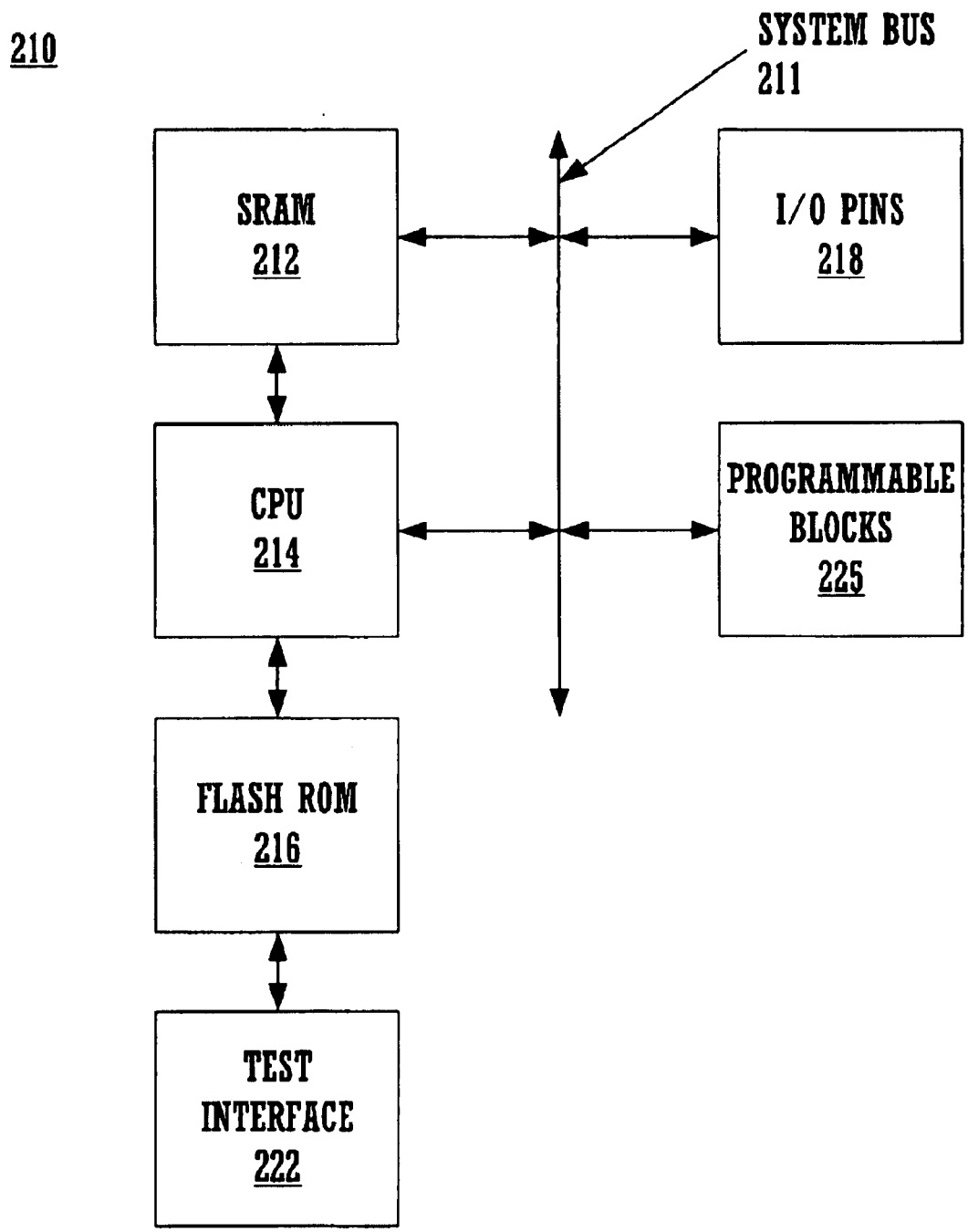
FIG. 2A is a block diagram of an exemplary programmable single-chip architecture used with one embodiment of the present invention.

FIG. 2A is a block diagram of an integrated circuit (or microcontroller) 210 that exemplifies a microcontroller which uses a programmable architecture. In the illustrated embodiment, integrated circuit 210 includes a system bus 211, and coupled to bus 211 are synchronous random access memory (SRAM) 212 for storing volatile or temporary data during firmware execution, central processing unit (CPU) 214 for processing information and instructions, flash read-only memory (ROM) 216 for holding instructions (e.g., firmware), input/output (I/O) pins 218 providing an interface with external devices and the like, and programmable system blocks 225. The programmable blocks 225 include analog blocks and digital blocks, which are further described below (see FIG. 2B).

Figure 2B:
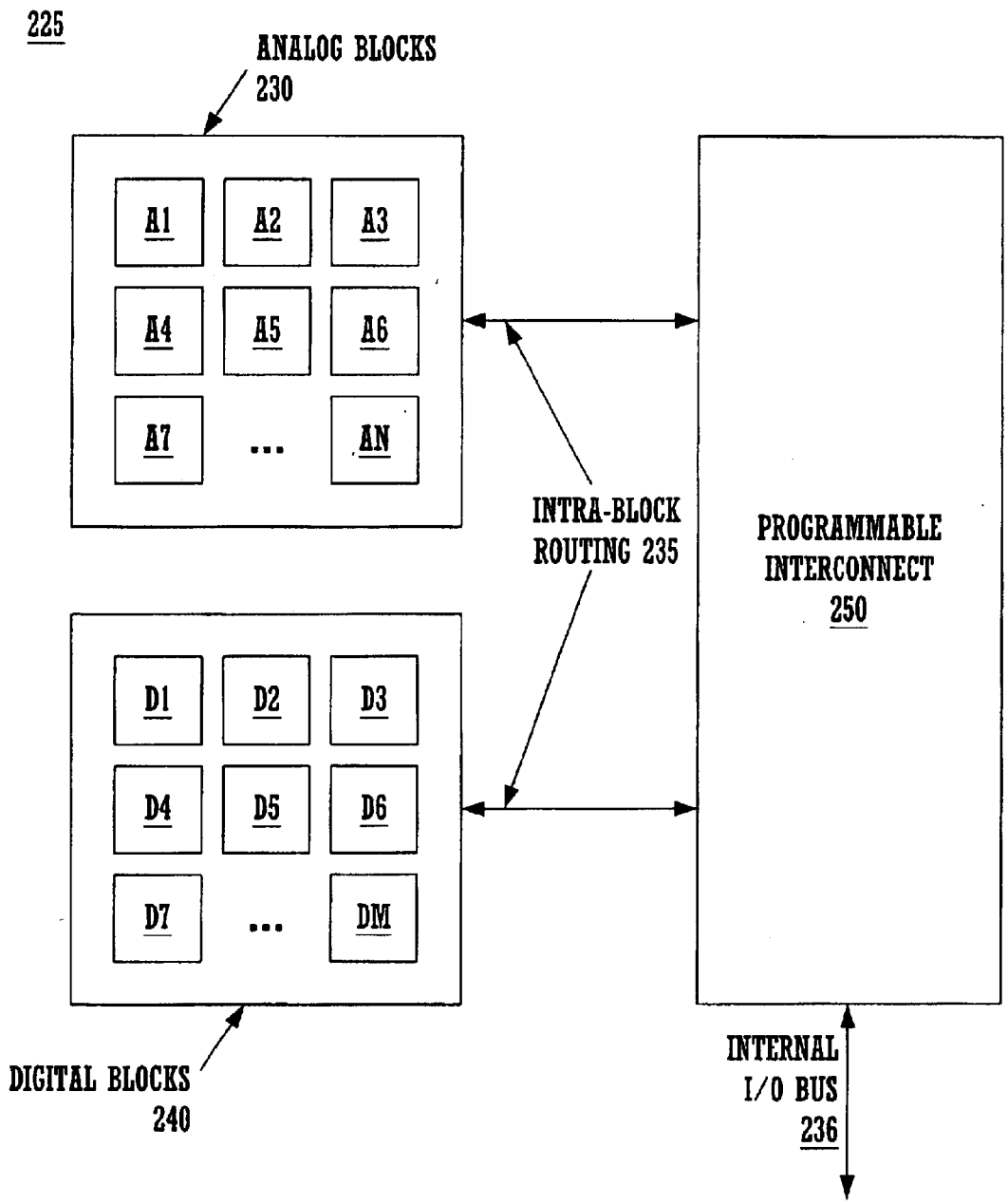
FIG. 2B is a block diagram of an exemplary arrangement of programmable blocks used with one embodiment of the present invention.

Referring to FIG. 2B, an embodiment of programmable system block 225 is depicted in greater detail. In this embodiment, programmable system block 225 includes an analog functional block 230, a digital functional block 240, and a programmable interconnect 250. Analog block 230 includes, in the present embodiment, a matrix of interconnected analog blocks A1 through AN. The number N may be any number of analog blocks. Likewise, digital block 240 includes, in the present embodiment, a matrix of interconnected digital blocks D1 through DM. The number M may be any number of digital blocks. The analog blocks A1 through AN and the digital blocks D1 through DM are fundamental building blocks that may be combined in different ways to accomplish different functions. Importantly, different combinations of blocks, producing different functions, may exist at different times within the same system. For example, a set of blocks configured to perform the function of analog-to-digital conversion may sample a signal. After processing that signal in the digital domain, those same blocks (perhaps in conjunction with a few others) may be recombined in a different configuration to perform the function of digital-to-analog conversion to produce an output signal.

Continuing with reference to FIG. 2B, the internal matrices of analog blocks 230 and digital blocks 240 may be constituted, in one embodiment, by a routing matrix described further in the patent application referenced above. Analog blocks 230 and digital blocks 240 are electrically and/or communicatively coupled to programmable interconnect 250, in the present embodiment, by intra-block routing 235. Each individual functional unit, e.g., analog blocks A1 through AN and digital blocks D1 through DM, may communicate and interact with each and/or any other functional unit. Which functional unit communicates with which other functional unit is programmable, in the present embodiment, via the configurability of the programmable interconnect 250. The programmable interconnect 250 is connected via an internal input/output (I/O) bus 236 to pin-by-pin configurable I/O transceivers (pins) 218 (FIG. 2A), which effect communicative coupling between integrated circuit 210 (FIG. 2A) and external modalities. The total pin count of pin-by-pin configurable I/O pins 218 may vary from one application to another, depending on the system device under consideration.

Figure 3:
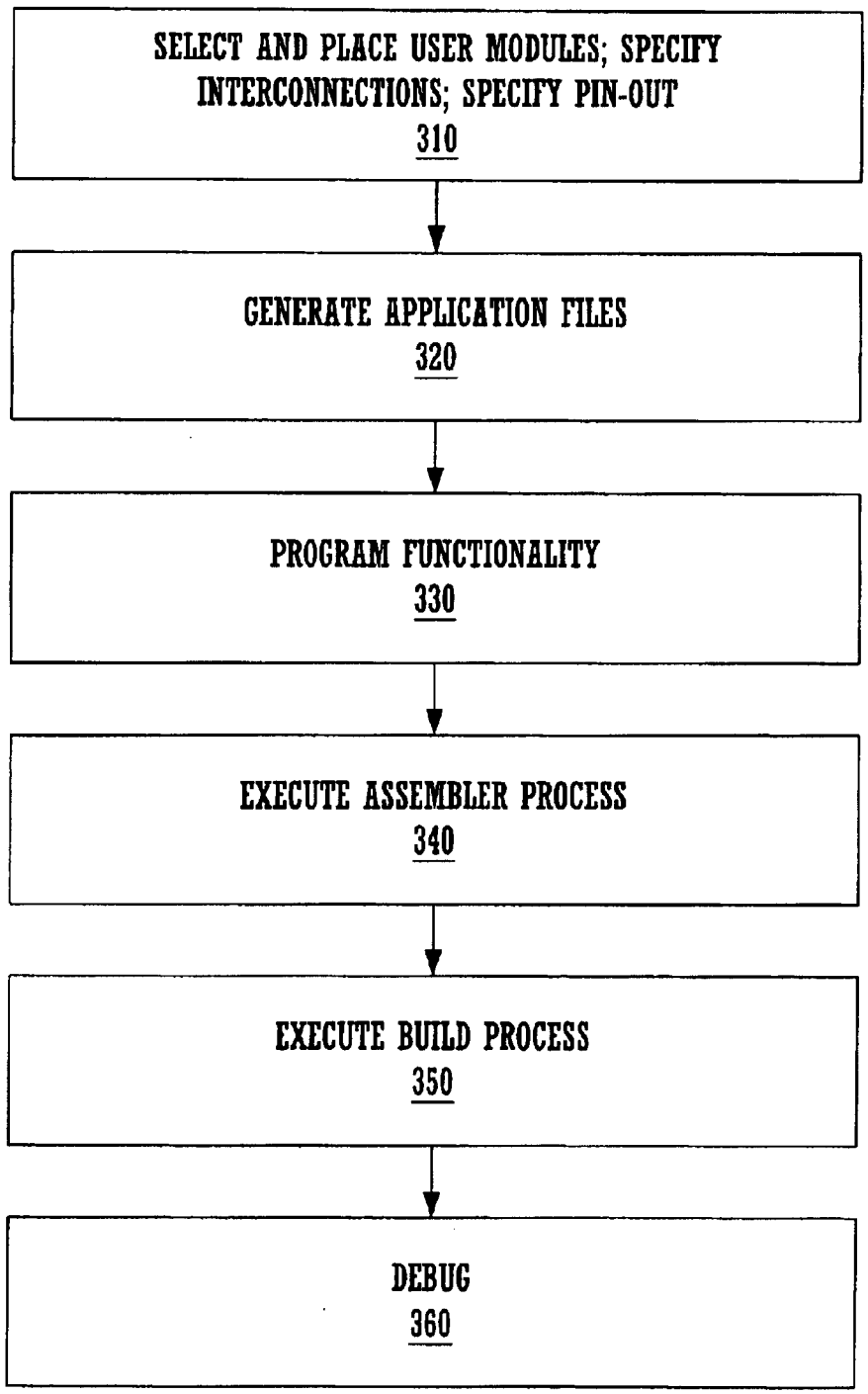
FIG. 3 is a flowchart of a process used by a microcontroller design tool in accordance with one embodiment of the present invention.

With reference next to FIG. 3, process 300 illustrates exemplary steps used by a microcontroller design tool in accordance with one embodiment of the present invention. The purpose of process 300 is to configure, program, compile, build, emulate and debug a customized microcontroller (a "target device") based on the integrated circuit 210 and SoC blocks 225 of FIGS. 2A and 2B.

In one embodiment, process 300 of FIG. 3 is carried out by a processor under the control of computer-readable and computer-executable instructions. The computer-readable and computer-executable instructions reside, for example, in data storage features such as computer usable volatile memory 102, computer-usable non-volatile memory 103, and/or data storage device 104 of FIG. 1. The computer-readable and computer-executable instructions are used to control or operate in conjunction with, for example, central processing unit 101 of FIG. 1.

Although specific steps are disclosed in process 300 of FIG. 3, such steps are exemplary. That is, the present invention is well suited to use with various other steps or variations of the steps recited in process 300. Additionally, for purposes of clarity and brevity, the following discussion and examples specifically deal with a microcontroller design tool. The present invention, however, is not limited solely to use with a microcontroller design tool. Instead, the present invention is well suited to use with other types of computer-aided hardware and software design systems in which it is necessary to accomplish a multitude of tasks as part of an overall process.

In step 310, applicable "user modules" are selected. A user module, as used herein, is a preconfigured function that may be based on more than one programmable block. A user module, once placed and programmed, will work as a peripheral on the target device. At any time in process 300, user modules may be added to or removed from the target device.

The selected user modules can then "placed" or "mapped" onto the programmable blocks 225 of FIG. 2B. Once a user module is placed, its parameters can be viewed and modified as needed. Global parameters used by all of the user modules (for example, CPU clock speed) can also be set.

Continuing with step 310 of FIG. 3, interconnections between the selected user modules can be specified, either as each user module is placed or afterwards. The pin-out for each PSOC block can be specified, making a connection between the software configuration and the hardware of the target device.

In step 320, application files can be generated. When application files are generated, existing assembly-source and C compiler code are updated for all device configurations, and application program interfaces (APIs) and interrupt service routines (ISRs) are generated.

In step 330, the desired functionality can be programmed into the target device. Source code files can be edited, added or removed.

In step 340, the assembler process can be executed. The assembler operates on an assembly-language source to produce executable code. This code is compiled and built into an executable file that can be downloaded into an emulator, where the functionality of the target device can be emulated and debugged.

In step 350, the target device can be "built." Building the target device links all the programmed functionalities of the source files (including device configuration), which are downloaded to a file for debugging.

In step 360, the target device can be emulated using an in-circuit emulator for debugging. The emulator allows the target device to be tested in a hardware environment while device activity is viewed and debugged in a software environment.

Figure 4:
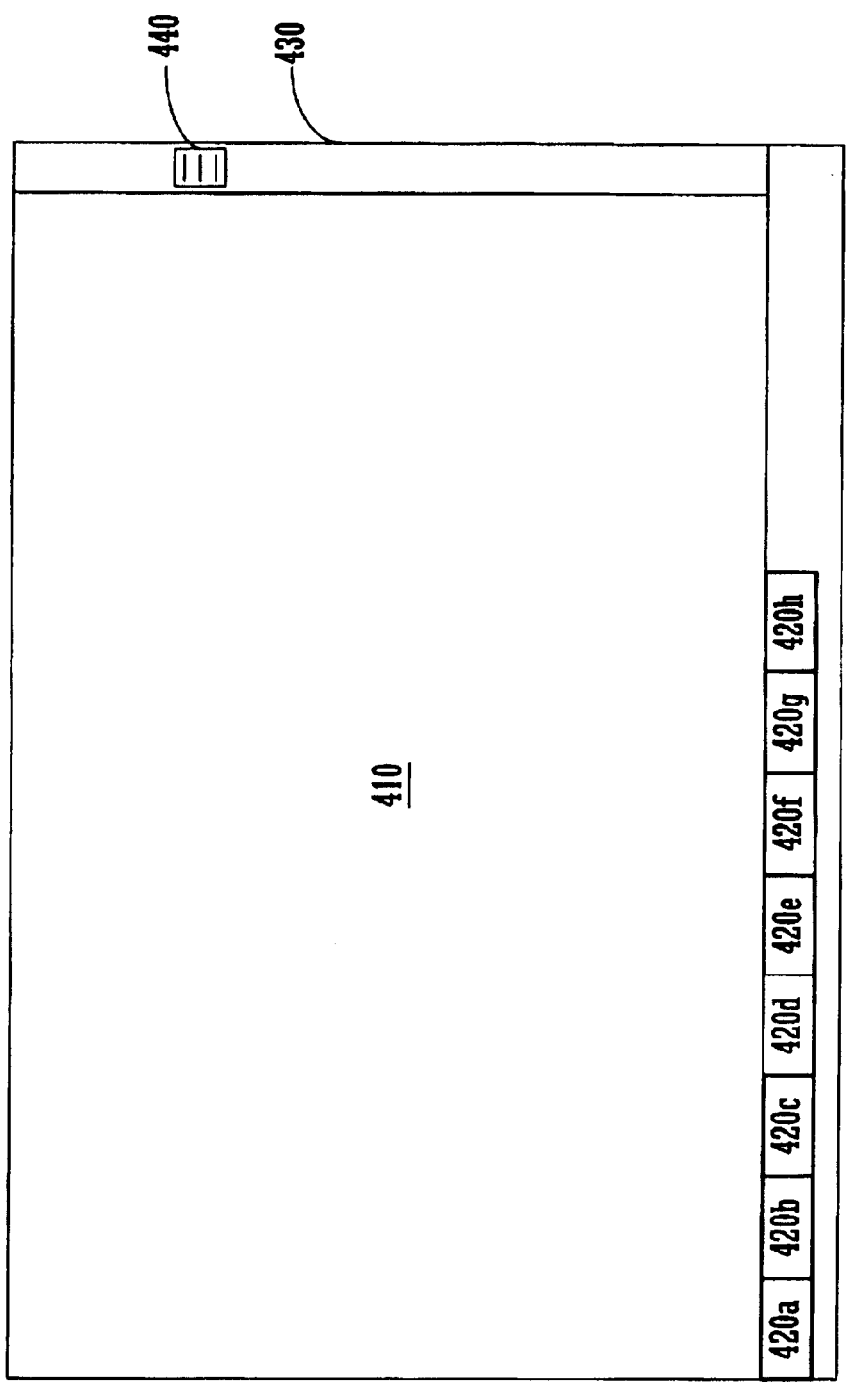
FIG. 4 illustrates an exemplary graphical user interface of an electronic document with data-driven tabs in accordance with one embodiment of the present invention.

FIG. 4 illustrates an exemplary graphical user interface (GUI) of an electronic document with data-driven tabs that is generated in accordance with one embodiment of the present invention. In one embodiment, these GUIs are displayed on display device 105 of computer system 190 (FIG. 1). It is appreciated that these GUIs are exemplary only, and that they may include different numbers and shapes of elements and windows other than those that are illustrated.

FIG. 4 shows a GUI 400 comprising electronic document 410, graphic elements 420a–420h, scroll bar 430 and scroll box 440. In one embodiment, the graphic elements are rendered as tabs. As will be seen, the graphic elements correspond to locations within electronic document 410 in order to facilitate easy and efficient browsing of the electronic document.

In accordance with the present invention, each graphic element corresponds to a location within electronic document 410. A graphic element, when selected (e.g., interacted with) jumps or scrolls the electronic document to the corresponding location within the document which the browser displayed in the screen. In one embodiment, highlighting or changing the color of the graphic element indicates a selected graphic element. In another embodiment, a selected graphic element is by bolding or otherwise altering the text within the graphic element. In another embodiment, a selected graphic element is indicated by placing the selected graphic element in the foreground of all graphic elements (e.g., graphic element 420d of FIG. 4).

Elements are selected by a user using well-known GUI techniques. That is, for example, a user can position a cursor over an element and "click" a cursor control element (e.g., a mouse) to select an element. When the elements are rendered as tabs, a selected element is depicted as described above. In general, a selected element is rendered in a way that allows the user to readily determine which element has been selected.

The graphic elements are determined by the contents of electronic document 410. Electronic document 410 comprises a number of indicators for indicating a predetermined location within the document. In one embodiment, the indicators are embedded anchors. It should be appreciated that the indicators are predefined by the author of electronic document 410. For example, consider the case where electronic document 410 is a novel divided into chapters. The author may desire to place indicators at the beginning of each chapter, such that graphic elements are rendered for each chapter of the novel, allowing a user to jump to particular chapters.

In one embodiment, electronic document 410 is a datasheet providing technical details of a corresponding user module (e.g., peripheral), wherein a user module is a preconfigured function operating on a microcontroller. For example, indicators placed in the current embodiment would correspond to particular sections of the datasheet (e.g., Overview, Diagram, Features and Registers). It should be appreciated that the specific indicators would be determined by the particular datasheet selected, and that the above indicators are exemplary only.

In one embodiment, the electronic document is an HTML document. It should be appreciated that any format for generating or creating electronic documents may be used (e.g., XML), and that the present invention is not intended to be limited to any particular form of electronic document. In one embodiment, the indicators are embedded HTML anchors within the document. It should be appreciated that the indicators are typically hidden from a user, but that the content of the indicator is typically visible.

It should be appreciated that an electronic document can have any number of associated graphic elements, and is not limited to the eight graphic elements 420a–420h as shown in FIG. 4.

In one embodiment, when a graphic element is selected, electronic document 410 jumps to the location of the corresponding graphic element. In one embodiment, when a graphic element is selected, scroll box 440 moves to a corresponding location of scroll bar 430, indicating a current location within electronic document 410. Likewise, in one embodiment, when scroll box 440 is moved to a different location within scroll bar 430, the graphic element corresponding to the location within electronic document 440 is selected.

Figure 5:
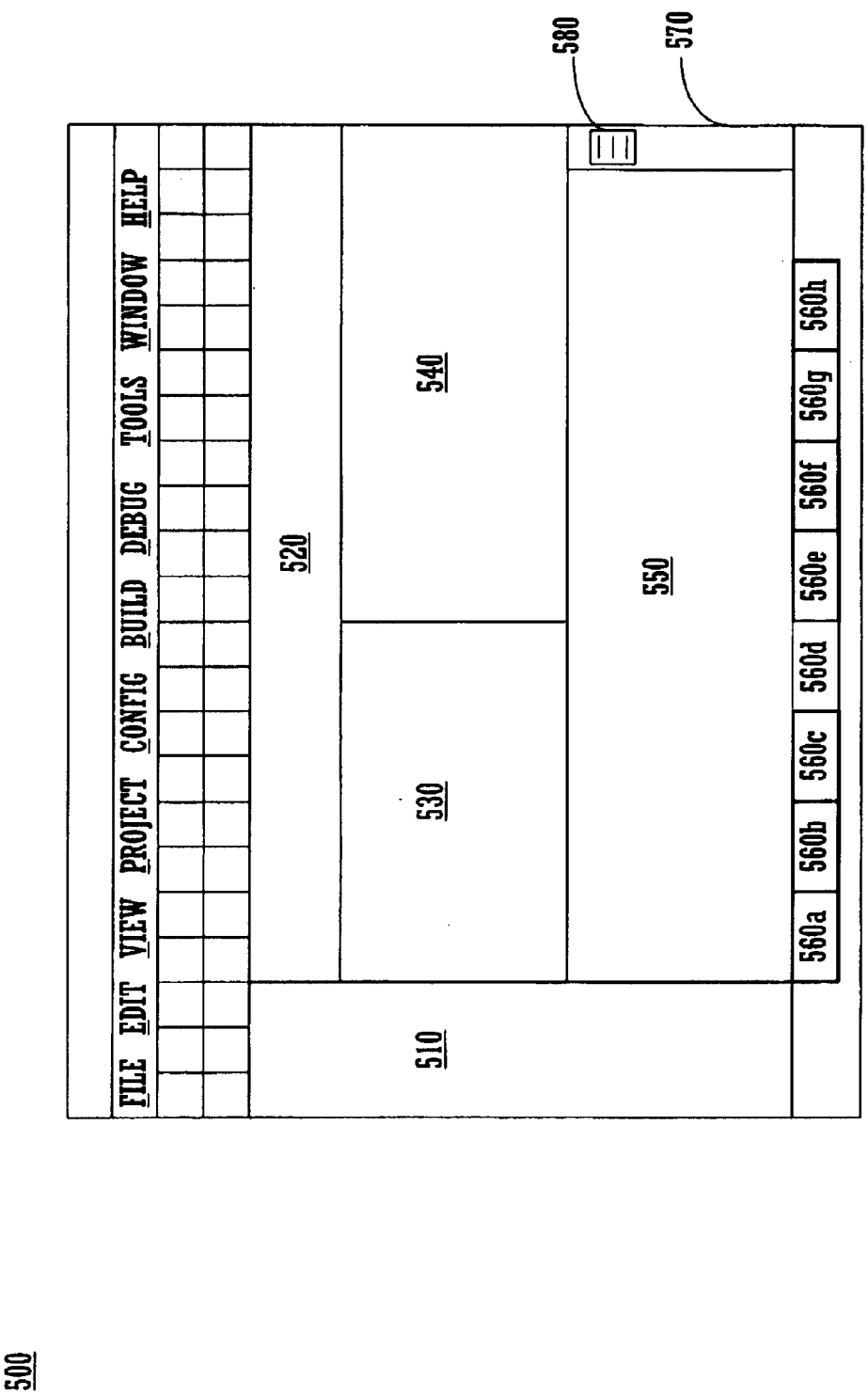
FIG. 5 illustrates an exemplary graphical user interface of a microcontroller design application having a datasheet with data-driven tabs in accordance with one embodiment of the present invention.

FIG. 5 illustrates an exemplary workspace 500 as displayed on a graphical user interface (GUI) of a microcontroller design application having a datasheet with data-driven tabs in accordance with one embodiment of the present invention. In one embodiment, these GUIs are displayed on display device 105 of computer system 190 (FIG. 1). It is appreciated that these GUIs are exemplary only, and that they may include different numbers and shapes of elements and windows other than those that are illustrated.

FIG. 5 shows a workspace 500 comprising a number of open windows 510, 520, 530 and 540, a datasheet 550, a number of graphic elements 560a–560h, scroll bar 570 and scroll box 580. A datasheet provides specific technical details for a user module, such as timing diagrams, pin outs, stacks, a detailed description and other information essential to microcontroller designers for selecting the correct user module. In one embodiment, the graphic elements are rendered as tabs. As will be seen, the graphic elements correspond to locations within datasheet 550 in order to facilitate easy and efficient browsing of datasheet 550.

In one embodiment, window 510 is a catalog of available user modules (e.g., peripheral), wherein a user module is a pre-configured function operating on a microcontroller. In one embodiment, window 520 is a listing of selected user modules. In one embodiment, window 530 is a schematic for a selected user module. In one embodiment, window 540 is a histogram showing the available resources of a microcontroller.

In accordance with the present invention, each graphic element corresponds to a location within datasheet 550. A graphic element, when selected (e.g., interacted with) jumps or scrolls the electronic document to the corresponding location within the document. In one embodiment, highlighting or changing the color of the graphic element indicates a selected graphic element. In another embodiment, a selected graphic element is by bolding or otherwise altering the text within the graphic element. In another embodiment, a selected graphic element is indicated by placing the selected graphic element in the foreground of all graphic elements (e.g., graphic element 560d of FIG. 5).

As described above, elements are selected by a user in a conventional manner. That is, for example, a user can position a cursor over an element and "click" a cursor control element (e.g., a mouse) to select an element. When the elements are rendered as tabs, a selected element is depicted as described above. In general, a selected element is rendered in a way that allows the user to readily determine which element has been selected.

The graphic elements are determined by the contents of datasheet 550. Datasheet 550 comprises a number of indicators for indicating a predetermined location within the document. In one embodiment, the indicators are embedded anchors. It should be appreciated that the indicators are predefined by the author of datasheet 550. For example, indicators placed in the current embodiment would correspond to particular sections of the datasheet (e.g., Overview, Diagram, Features and Registers). It should be appreciated that the specific indicators would be determined by the particular datasheet selected, and that the above indicators are exemplary only.

In one embodiment, datasheet 550 is an HTML document. It should be appreciated that any format for generating or creating electronic documents may be used (e.g., XML), and that the present invention is not intended to be limited to any particular form of electronic document. In one embodiment, the indicators are embedded HTML anchors within datasheet 550. It should be appreciated that the indicators are typically hidden from a user, but that the content of the indicator is typically visible.

It should be appreciated that an electronic document can have any number of associated graphic elements, and is not limited to the eight graphic elements 560a–560h as shown in FIG. 5.

In one embodiment, when a graphic element is selected, datasheet 550 jumps to the location of the corresponding graphic element. In one embodiment, when a graphic element is selected, scroll box 580 moves to a corresponding location of scroll bar 570, indicating a current location within datasheet 550. Likewise, in one embodiment, when scroll box 580 is moved to a different location within scroll bar 570, the graphic element corresponding to the location within datasheet 550 is selected.

Figure 6A:
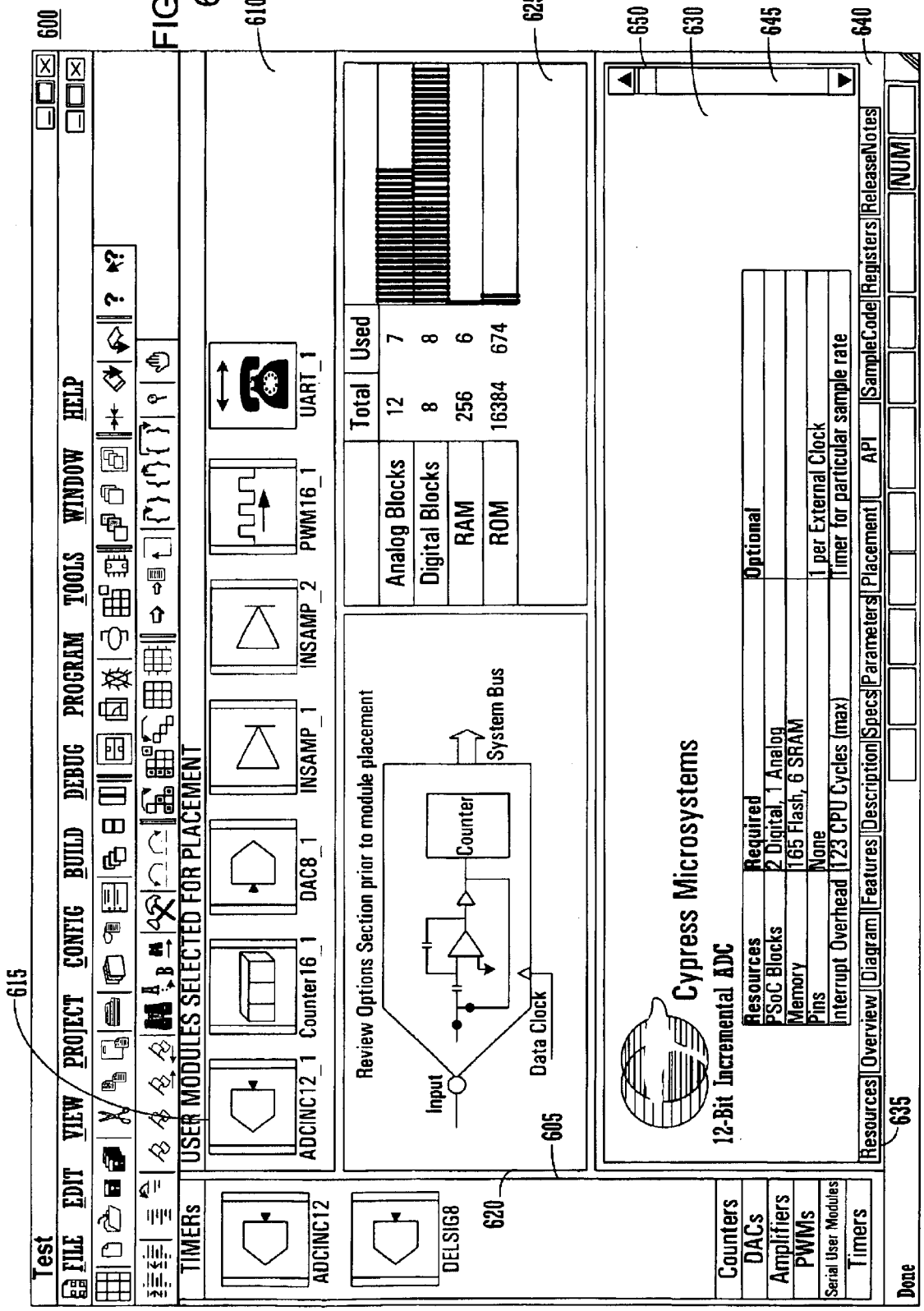
Figure 6B:
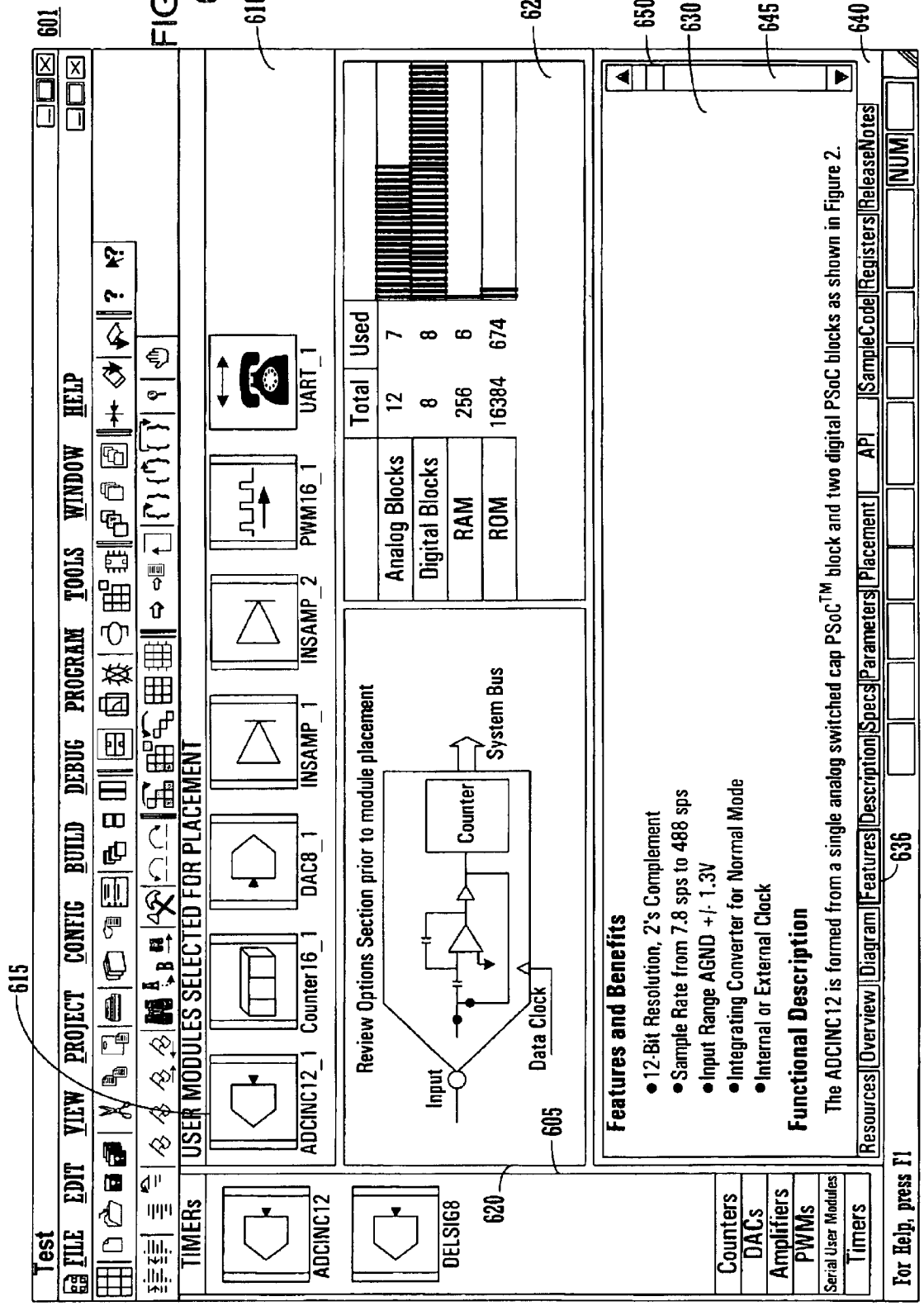
Figure 6C:
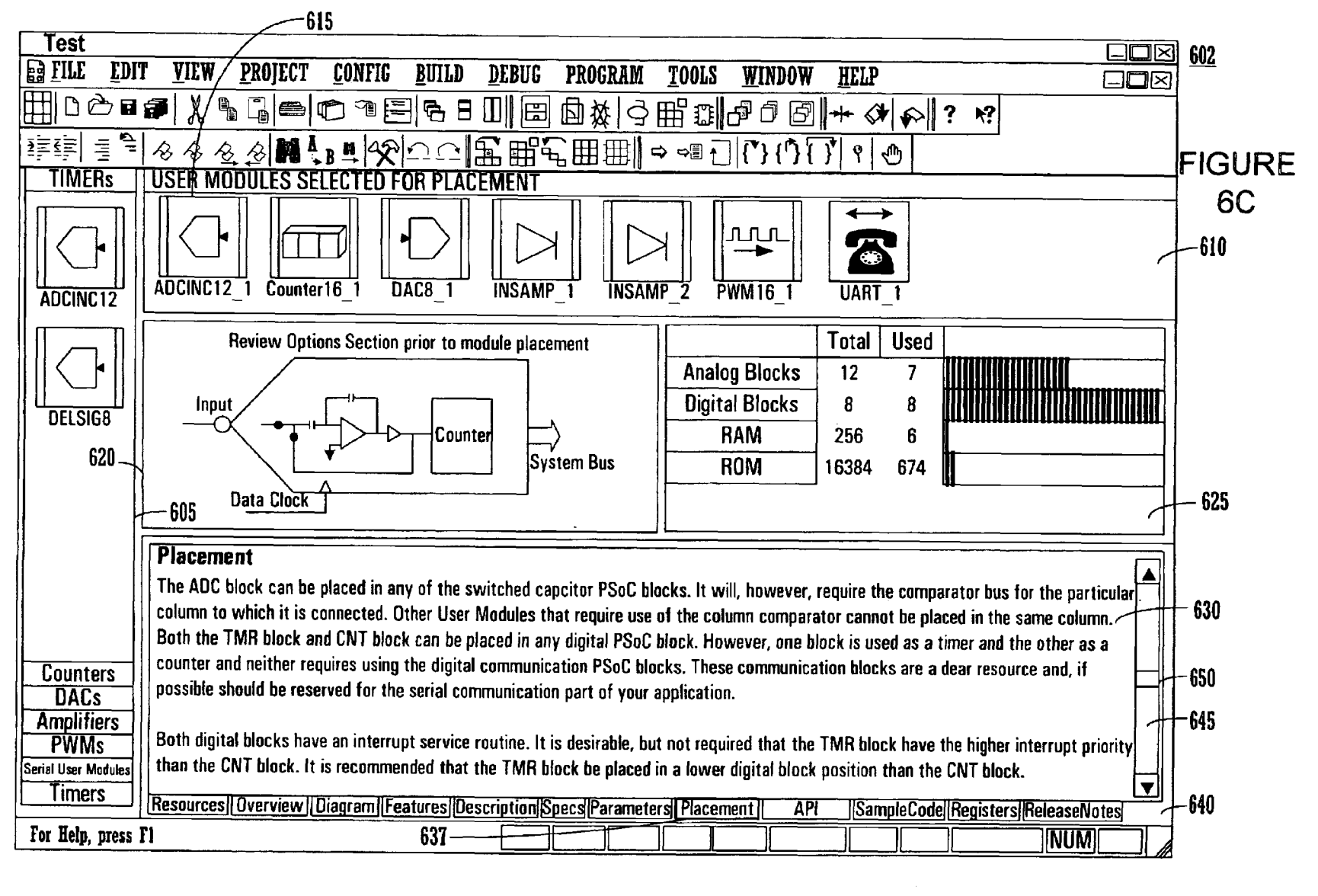

FIGS. 6A, 6B and 6C are exemplary screen shots of a microcontroller design application having a datasheet with data-driven tabs in accordance with one embodiment of the present invention. Workspaces 600, 601 and 602 of FIGS. 6A, 6B and 6C, respectively, comprise catalog window 605 comprising a catalog of all available user modules, selected user module window 610 comprising a listing of all user modules selected from catalog window 605, selected user module 615, schematic window 620 illustrating a schematic of selected user module 615, histogram window 625 illustrating available resources and datasheet 630. Datasheet 630 comprises data-driven tabs 640, scroll bar 645 and scroll box 650.

FIG. 6A illustrates an example where tab 635 of datasheet 630 is selected. Accordingly, datasheet 630 is scrolled to the location of the content associated with tab 635. Likewise, scroll box 650 is located at the appropriate location within scroll bar 645. In the present embodiment, tab 635 is entitled "Resources." Thus, the resources of selected user module 615 as described in datasheet 630.

FIG. 6B illustrates an example where tab 636 of datasheet 630 is selected. Accordingly, datasheet 630 is scrolled to the location of the content associated with tab 636. Likewise, scroll box 650 is located at the appropriate location within scroll bar 645. In the present embodiment, tab 636 is entitled "Features." Thus, the features and benefits of selected user module 615 as described in datasheet 630.

Similarly, FIG. 6C illustrates an example where tab 637 of datasheet 630 is selected. Accordingly, datasheet 630 is scrolled to the location of the content associated with tab 637. Likewise, scroll box 650 is located at the appropriate location within scroll bar 645. In the present embodiment, tab 637 is entitled "Placement." Thus, the placement of selected user module 615 as described in datasheet 630.

Figure 7:
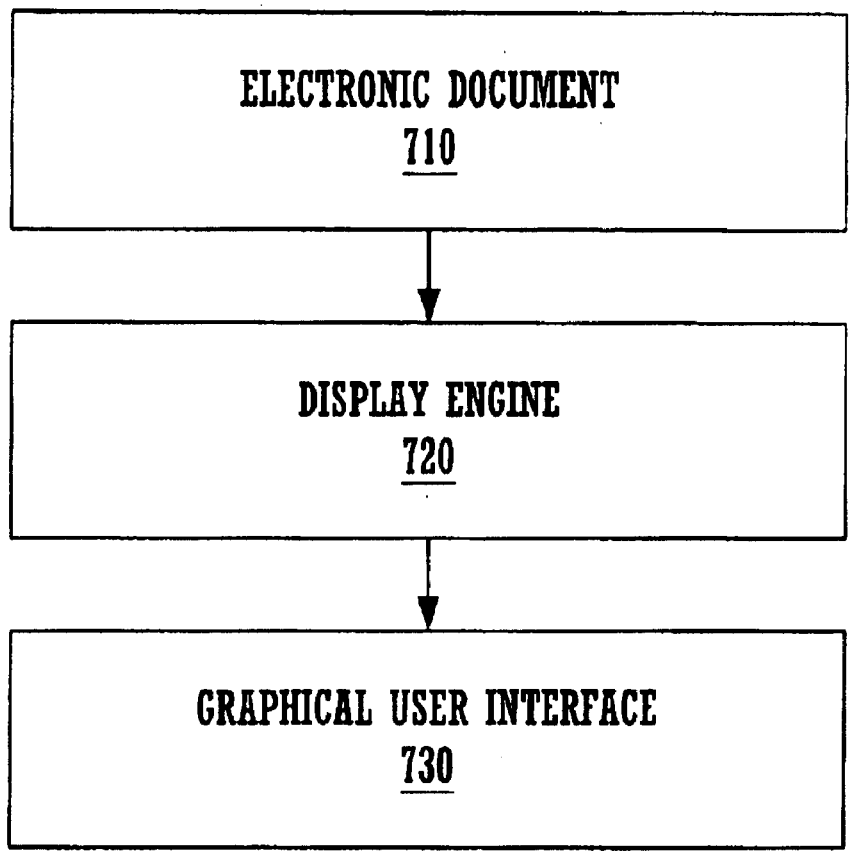
FIG. 7 is a block diagram of an exemplary tab generator for helping a user browse a document in accordance with one embodiment of the present invention.

FIG. 7 is a block diagram of an exemplary tab generator 700 for helping a user browse an electronic document 710 in accordance with one embodiment of the present invention. In one embodiment, tab generator 700 is implemented in software running on a computer system (e.g., computer system 190 of FIG. 1). In another embodiment, tab generator 700 is implemented in hardware. In another embodiment, tab generator 700 is implemented in firmware.

Display engine 720 receives an input of electronic document 710. In one embodiment, electronic document 710 is an HTML document. It should be appreciated that any format for generating or creating electronic documents may be used (e.g., XML), and that the present invention is not intended to be limited to any particular form of electronic document. In one embodiment, electronic document 710 comprises indicators or embedded anchors. In one embodiment, the indicators are embedded HTML anchors. It should be appreciated that the indicators are typically hidden from a user, but that the content of the indicator is typically visible.

It should be appreciated that electronic document is created by an author who determines the characteristics of the document. The author selects a format for generating the document, determines the content of the document, and is responsible for the appearance of the document. In one embodiment, the author includes indicators or embedded anchors in the document to designate separate sections or locations of the document.

Figure 8A:
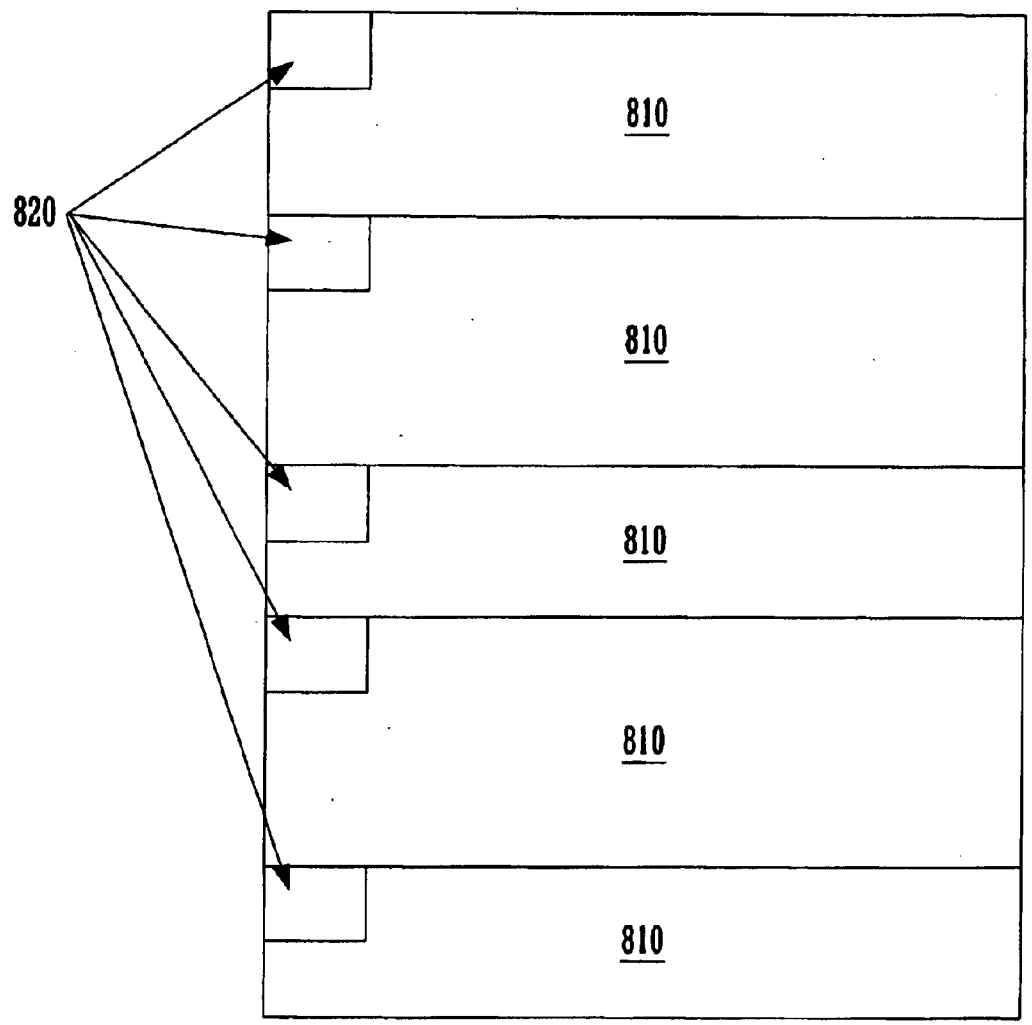
FIG. 8A is an illustration of an exemplary input electronic document with embedded anchors for generating tabs therefrom in accordance with one embodiment of the present invention.

With reference now to FIG. 8A, an illustration of an exemplary input electronic document 710 is shown. In one embodiment, electronic document 710 comprises a number of sections 810, each section having an embedded anchors 820 for generating tabs therefrom in accordance with one embodiment of the present invention. As explained above, the embedded anchors are placed by the author of electronic document 710, and are used to help a user efficiently browse the document.

With reference now to FIG. 8B, exemplary HTML code for an HTML document 850 with embedded anchors 860 and 870 for generating tabs therefrom is shown. In the one embodiment, HTML document 850 is a datasheet for a user module in accordance with the present invention. In the present embodiment, embedded anchors 860 and 870 are indicated in HTML code as "tab_ADCINC12" and "tab_Resources," respectively.

Returning to FIG. 7, display engine 720, upon receiving electronic document 710, scans electronic document 710 for indicators or embedded anchors. Display engine 720 generates tabs (e.g., graphic elements 420a–h of FIG. 4) based on the indicators or embedded anchors. In one embodiment, display engine 720 performs a process for helping a user browse a document as described in process 1000 of FIG. 10.

The data contained within electronic document 710 is used to generate the tabs. As the tabs are generated based on the data within each electronic document, and not based on the application itself, the content of the tabs is data-driven. Upon generating the tabs, GUI 730 displays electronic document 710 with corresponding tabs.

Figure 9:
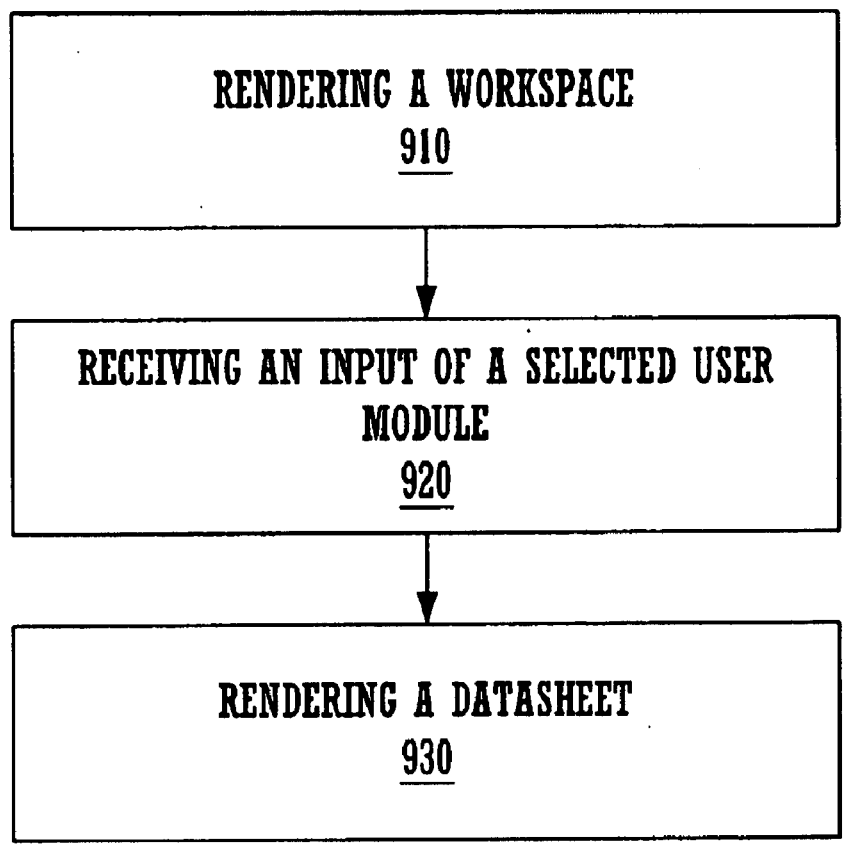
FIG. 9 is a flowchart of a process for helping a user design a microcontroller in accordance with one embodiment of the present invention.

FIG. 9 is a flowchart of a process 900 for helping a user design a microcontroller in accordance with one embodiment of the present invention and FIG. 10 is a flowchart of a process 1000 for helping a user browse a document in accordance with one embodiment of the present invention. In one embodiment, processes 900 and 1000 are carried out by a processor under the control of computer-readable and computer-executable instructions. The computer-readable and computer-executable instructions reside, for example, in data storage features such as computer usable volatile memory 102, computer-usable non-volatile memory 103, and/or data storage device 104 of FIG. 1. The computer-readable and computer-executable instructions are used to control or operate in conjunction with, for example, central processing unit 101 of FIG. 1.

Although specific steps are disclosed in processes 900 and 1000, such steps are exemplary. That is, the present invention is well suited to use with various other steps or variations of the steps recited in processes 900 and 1000. Additionally, for purposes of clarity and brevity, the following discussion and examples specifically deal with a microcontroller design tool. The present invention, however, is not limited solely to use with a microcontroller design tool. Instead, the present invention is well suited to use with other types of computer-aided hardware and software design systems in which it is necessary to accomplish a multitude of tasks as part of an overall process.

With reference first to process 900 of FIG. 9, at step 910, a workspace is rendered in a GUI displayed on a display device of a computer system. In the present embodiment, the workspace has multiple windows, wherein one window comprises at least one selectable user module, wherein the user module is a pre-configured function operating with a microcontroller.

At step 920, input is received indicating a selection of a user module. In one embodiment, a user module is selected in response to user selection or interaction.

At step 930, a datasheet is automatically rendered in a second window of the workspace. A datasheet provides technical details corresponding to the selected user module. In this manner, datasheets are rendered within a microcontroller design application for aiding a user in designing a microcontroller.

Referring now to process 1000 of FIG. 10, at step 1010, an electronic document is scanned for embedded anchors or indicators. The embedded anchors or indicators are for indicating a predetermined location within the electronic document. It should be appreciated that the electronic document can be rendered in any format for creating electronic documents.

At step 1020, tabs (e.g., graphic elements) are generated based on the content of each embedded anchor. Each tab is rendered according to information within the indicator, and thus is data-driven. That is, the tabs rendered are based on the information within the electronic document itself, rather than the application for rendering the electronic document. The tab is for communicating information concerning the location of specific content within an electronic document. Interacting with one of the tabs allows a user to jump to a predetermined location within the electronic document corresponding to the tab. In this manner, data-drive tabs are generated for easy browsing of electronic documents.

In summary, the present invention is used to render a workspace for helping a user design a microcontroller, rendering a workspace comprising a datasheet for a selectable user module and providing easy navigation of the datasheet. The user is provided with a workspace for helping a user select the desirable user modules for use with a microcontroller, while directly providing the user with the technical information to select the appropriate user module.

The preferred embodiment of the present invention, a method of rendering a workspace for helping a user design a microcontroller, is thus described. While the present invention has been described in particular embodiments, it should be appreciated that the present invention should not be construed as limited by such embodiments, but rather construed according to the below claims.

What is claimed is:

1. A method of rendering a workspace of a design tool for programming a microcontroller, said method comprising:

rendering said workspace, said workspace comprising multiple windows, wherein a first window of said workspace comprises at least one selectable user module, wherein said user module is a pre-configured electronic design to be implemented on said microcontroller;

receiving an input indicating a selection of a user module; and responsive to said selection, automatically rendering a datasheet in a second window of said workspace, wherein said datasheet provides technical details corresponding to said user module selected.

2. The method of claim 1 wherein said microcontroller comprises programmable analog and programmable digital elements.

3. The method of claim 1 wherein said first window comprises a catalog of a plurality of selectable user modules.

4. The method of claim 1 wherein said first window comprises a listing of selected user modules.

5. The method of claim 1 wherein said workspace further comprises a third window for rendering a histogram, said histogram displaying available hardware resources of said microcontroller not allocated to user modules.

6. The method of claim 1 wherein said workspace further comprises a fourth window for rendering a schematic diagram corresponding to said user module of said selection.

7. The method of claim 1 wherein said workspace further comprises at least one selectable tab, wherein said tab is rendered according to data of said datasheet, and wherein said tab is operable to navigate to a corresponding section of said datasheet.

8. A computer system comprising:

a bus;

a display device coupled to said bus;

a memory unit coupled to said bus, and a processor coupled to said bus, said processor for executing a method of rendering a workspace of a design tool for programming a microcontroller, said method comprising:

rendering said workspace, said workspace comprising multiple windows, wherein a first window of said workspace comprises at least one selectable user module, wherein said user module is a pre-configured electronic design to be implemented on said microcontroller;

receiving an input indicating a selection of a user module; and responsive to said selection, automatically rendering a datasheet in a second window of said workspace, wherein said datasheet provides technical details corresponding to said user module selected.

9. The computer system of claim 8 wherein said microcontroller comprises programmable analog and programmable digital elements.

10. The computer system of claim 8 wherein said first window comprises a catalog of a plurality of selectable user modules.

11. The computer system of claim 8 wherein said first window comprises a listing of selected user modules.

12. The computer system of claim 8 wherein said workspace further comprises a third window for rendering a histogram, said histogram displaying available hardware resources of said microcontroller not allocated to user modules.

13. The computer system of claim 8 wherein said workspace further comprises a fourth window for rendering a schematic diagram corresponding to said user module of said selection.

14. The computer system of claim 8 wherein said workspace further comprises at least one selectable tab, wherein said tab is rendered according to data of said datasheet, and wherein said tab is operable to navigate to a corresponding section of said datasheet.

15. A computer-usable medium having computer-readable program code embodied therein for causing a computer system to perform a method of rendering a workspace of a design tool for programming a microcontroller, said method comprising:

rendering said workspace, said workspace comprising multiple windows, wherein a first window of said workspace comprises at least one selectable user module, wherein said user module is a pre-configured electronic design to be implemented on said microcontroller;

receiving an input indicating a selection of a user module; and responsive to said selection, automatically rendering a datasheet in a second window of said workspace, wherein said datasheet provides technical details corresponding to said user module selected.

16. The computer-usable medium of claim 15 wherein said microcontroller comprises programmable analog and programmable digital elements.

17. The computer-usable medium of claim 15 wherein said first window comprises a catalog of a plurality of selectable user modules.

18. The computer-usable medium of claim 15 wherein said first window comprises a listing of selected user modules.

19. The computer-usable medium of claim 15 wherein said workspace further comprises a third window for rendering a histogram, said histogram displaying available hardware resources of said microcontroller not allocated to user modules.

20. The computer-usable medium of claim 15 wherein said workspace further comprises a fourth window for rendering a schematic diagram corresponding to said user module of said selection.

21. The computer-usable medium of claim 15 wherein said workspace further comprises at least one selectable tab, wherein said tab is rendered according to data of said datasheet, and wherein said tab is operable to navigate to a corresponding section of said datasheet.

22. A graphical user interface comprising:

a first display region for displaying a plurality of icons, each icon associated with a respective user module, said first display region for presenting icons for user selection thereof and wherein each user module represents an electronic circuit design for implementation on hardware resources of a programmable electronic device; and a second display region for displaying a datasheet of a selected user module of said first display region, wherein said datasheet comprises technical information regarding said selected icon.

23. A graphical user interface as described in claim 22 further comprising a third display region for displaying a histogram of allocated hardware resources of said programmable electronic device.

24. A graphical user interface as described in claim 22 wherein said programmable electronic device is a programmable microcontroller device.

25. A graphical user interface as described in claim 22 wherein said datasheet is generated based on an electronic document comprising a plurality of sections and wherein each section comprises an associated anchor.

26. A graphical user interface as described in claim 25 wherein said datasheet comprises:

a first display region comprising a plurality of graphical tabs for user selection thereof, one tab for each anchor, wherein each tab comprises a descriptive label obtained from its respective anchor; and a second display region for displaying a portion of a section of said electronic document associated with a selected tab.

* * * * *